United States Patent
Haag et al.

(10) Patent No.: US 7,678,239 B2
(45) Date of Patent: Mar. 16, 2010

(54) SLIDING ANODE MAGNETRON SPUTTERING SOURCE

(75) Inventors: Walter Haag, Grabs (CH); Pius Gruenenfelder, Wangs (CH)

(73) Assignee: Oerlikon Solar IP AG, Trubbach, Trubbach (CH)

( * ) Notice: Subject to any disclaimer, the term of this patent is extended or adjusted under 35 U.S.C. 154(b) by 937 days.

(21) Appl. No.: 10/912,365

(22) Filed: Jul. 23, 2004

(65) Prior Publication Data

US 2005/0034975 A1     Feb. 17, 2005

Related U.S. Application Data

(60) Provisional application No. 60/490,201, filed on Jul. 25, 2003.

(51) Int. Cl.
  *C23C 14/35*     (2006.01)
(52) U.S. Cl. .............. 204/192.12; 204/192.13; 204/298.03; 204/298.08; 204/298.14
(58) Field of Classification Search ............ 204/192.12, 204/298.08, 298.14, 192.13, 298.03
  See application file for complete search history.

(56) References Cited

U.S. PATENT DOCUMENTS 5,882,492 A * 3/1999 Manley et al. ......... 204/298.08
6,063,245 A   5/2000 Frach et al.
6,340,416 B1 * 1/2002 Goedicke et al. ....... 204/192.12

FOREIGN PATENT DOCUMENTS

DE       252205 A1    12/1987
JP       03-064460  *  3/1991
WO       0175187 A1   10/2001

* cited by examiner

*Primary Examiner*—Rodney G McDonald
(74) *Attorney, Agent, or Firm*—Pearne & Gordon LLP

(57) ABSTRACT

A magnetron sputtering source includes a plurality of electrodes and a switching circuit. The switching circuit sequentially connects each of the plurality of electrodes to a ground reference, making it anodic, while connecting the remaining of the plurality of electrodes as cathodes. A method of operating the magnetron sputtering source includes steps of: providing a plurality of target arrangements; causing each of the plurality of target arrangements to act as a cathode; and sequentially causing each of the plurality of cathodes to temporarily act as an anode.

16 Claims, 3 Drawing Sheets

SLIDING ANODE MAGNETRON SPUTTERING SOURCE

CROSS-REFERENCE TO RELATED APPLICATIONS

This application claims the benefit of U.S. Provisional Application No. 60/490,201, filed Jul. 25, 2003, hereby incorporated herein by reference.

BACKGROUND OF THE INVENTION

The present invention relates to a sputter deposition process for large area thin film deposition, and more particularly to a magnetron sputtering source having one or more sliding anodes.

Sputter deposition is used in many applications for thin film deposition of various materials on various substrates. Large area coatings for displays, functional coatings (e.g. on architectural glass) or solar cells require a certain uniformity of the film-thickness over the whole substrate area.

Two basic approaches are known for performing sputter deposition. So-called "inline-processing" involves a substrate that is moved alongside a small coating source and is thereby coated with a respective layer. "Single substrate processing" involves coating the entire substrate "at once," without moving either the source or substrate during deposition. Single substrate processing is normally preferred since it performs the sputter deposition more quickly. This normally requires a coating source that is equal to or larger than the size of the substrate. Such single, large cathodes, however, suffer from an increasing non-uniformity with increasing substrate size due to physical limitations.

For instance, increasing the glass-to-target distance too much can lead to layer problems. On the other hand, if the glass is too close to the targets there will be a lack of electrons in the middle region of the glass, leading to poor layer uniformity.

To get more electrons to the middle of the glass without increasing the glass-to-target distance, greater anode surface area must be provided. To accomplish this, several approaches have been proposed.

One general approach involves providing an array of small cathodes in various orders and arrangements, such as parallel bars, checker-board patterns, and the like. U.S. Pat. No. 6,093,293 to Haag et al., incorporated herein by reference, describes an arrangement of several bar-shaped targets mounted one alongside the other and separated by respective slits. Each of the target arrangements includes a respective electric pad to allow it to be operated electrically independently from the other target arrangement. Further, each target arrangement includes a controlled magnet arrangement generating a time-varying magnetron field upon the target arrangement. Each of the magnet arrangements is controlled independently from the others.

Even such cathode arrays have size limitations, since it is impractical and technically not feasible to raise the number of cathodes arbitrarily with each upscale of the deposition system. Therefore, a further approach for improving sputter deposition uniformity for large substrates is needed.

A major problem with increasing cathode size is a decrease of the electrical field density in the center of the cathode. This decrease results in a lower plasma density and therefor in a lower deposition rate. To avoid this potential drop towards the center of the cathode, it is necessary to provide an anode near the center. Due to limited space between the targets it is not possible to install permanent anodes with sufficient conductivity without raising the danger of arcing during the deposition process.

SUMMARY OF THE INVENTION

According to the present invention, a magnetron sputtering source comprises: a plurality of electrodes, and a switching circuit for sequentially connecting each of said plurality of electrodes to a ground reference and connecting the remaining of said plurality of electrodes as cathodes.

According to a further aspect of the present invention, a method of operating a magnetron sputtering source comprises steps of: providing a plurality of target arrangements; causing each of said plurality of target arrangements to act as a cathode; and sequentially causing each of said plurality of cathodes to temporarily act as an anode.

DETAILED DESCRIPTION OF THE INVENTION

According to the present invention, in order to provide an anode in the vicinity of the cathode center, each of a set of electrodes having targets is alternating switched to ground during the sputtering process. In this way a homogeneous electrical field distribution is provided and the uniformity of the deposited films over the whole area is improved.

As shown by way of example in FIGS. 1A, 1B, 1C and 1D, an array 10 of spaced apart, bar-shaped target arrangements 12a, 12b, 12c, 12d, 12e, 12f are provided. Each of the target arrangements 12a-12f is connected as an electrode to a switching circuit 14. The switching circuit connects each of the target arrangements in "deposition mode" as cathodes and then, in sequential fashion, connects one or more of the target arrangements to a ground potential, causing them to temporarily act as anodes, also referred to as "anode mode."

In order to provide the optimal deposition conditions for different target and substrate materials and for different system setups, several parameters can be adjusted as necessary. According to the present embodiment as shown in the timing diagram of FIG. 2, $AS_{ON}$, the time for a target to be switched to and kept in an anode state, can vary from 1 to 300 milliseconds. Similarly, $AS_{ON}$, a waiting time between switching off one anode and switching on the next anode, can vary from 0 to 500 milliseconds. Further, it is possible to choose which target arrangements are switched to the anode state during deposition by setting "ENABLE" equal to "YES" or "NO." For example, for cathode #3, "ENABLE" is set to "NO," and therefore cathode #3 will be skipped in the switching sequence and always remain powered as a cathode. TS, indicates the starting target(s), indicating which target arrangement or arrangements will be switched to anode state when the switching circuit is started.

In laboratory tests, we have observed an improvement of the thickness non-uniformity from 15%, without using the sliding anode arrangement, to 5% using the sliding anode of the present invention. Conditions were identical in all other respects. The test sliding anode arrangement had the following settings: ASOn=5 ms; ASOff=0 ms; enable ="yes" for middle target arrangements #2 to #9; TS =#3 and #7.

Figure 1A:
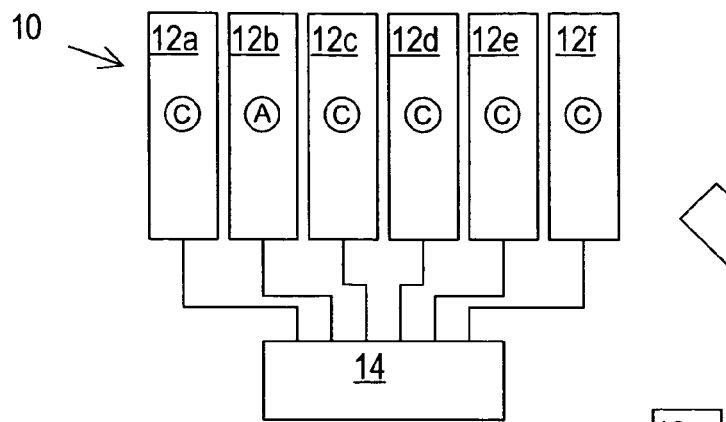
FIGS. 1A-1D are schematic drawings showing a sliding anode sputtering source arrangement at sequential points in time according an example embodiment of the present invention.
Figure 1B:
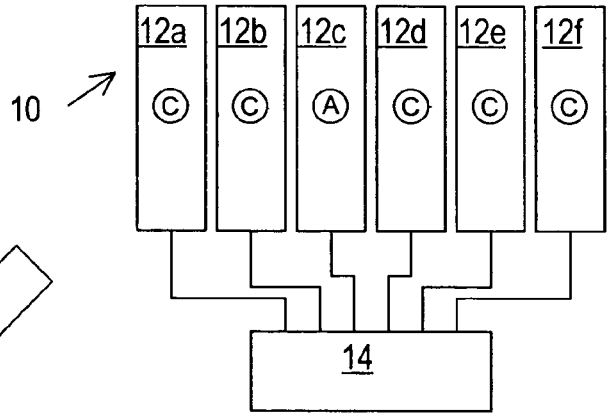
Figure 1C:
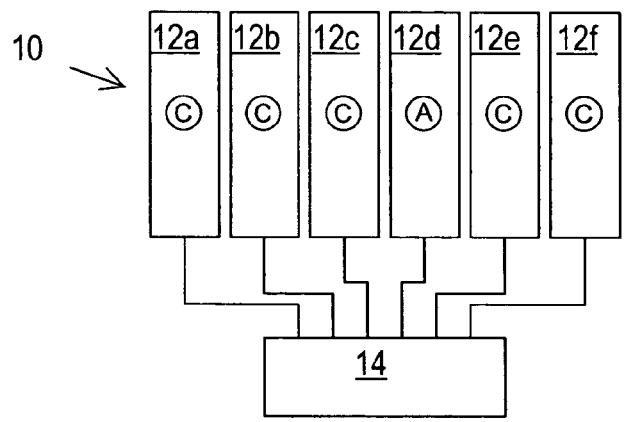
Figure 1D:
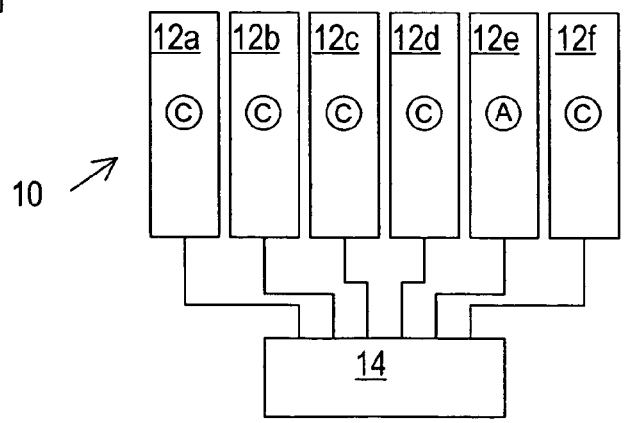
Figure 2:
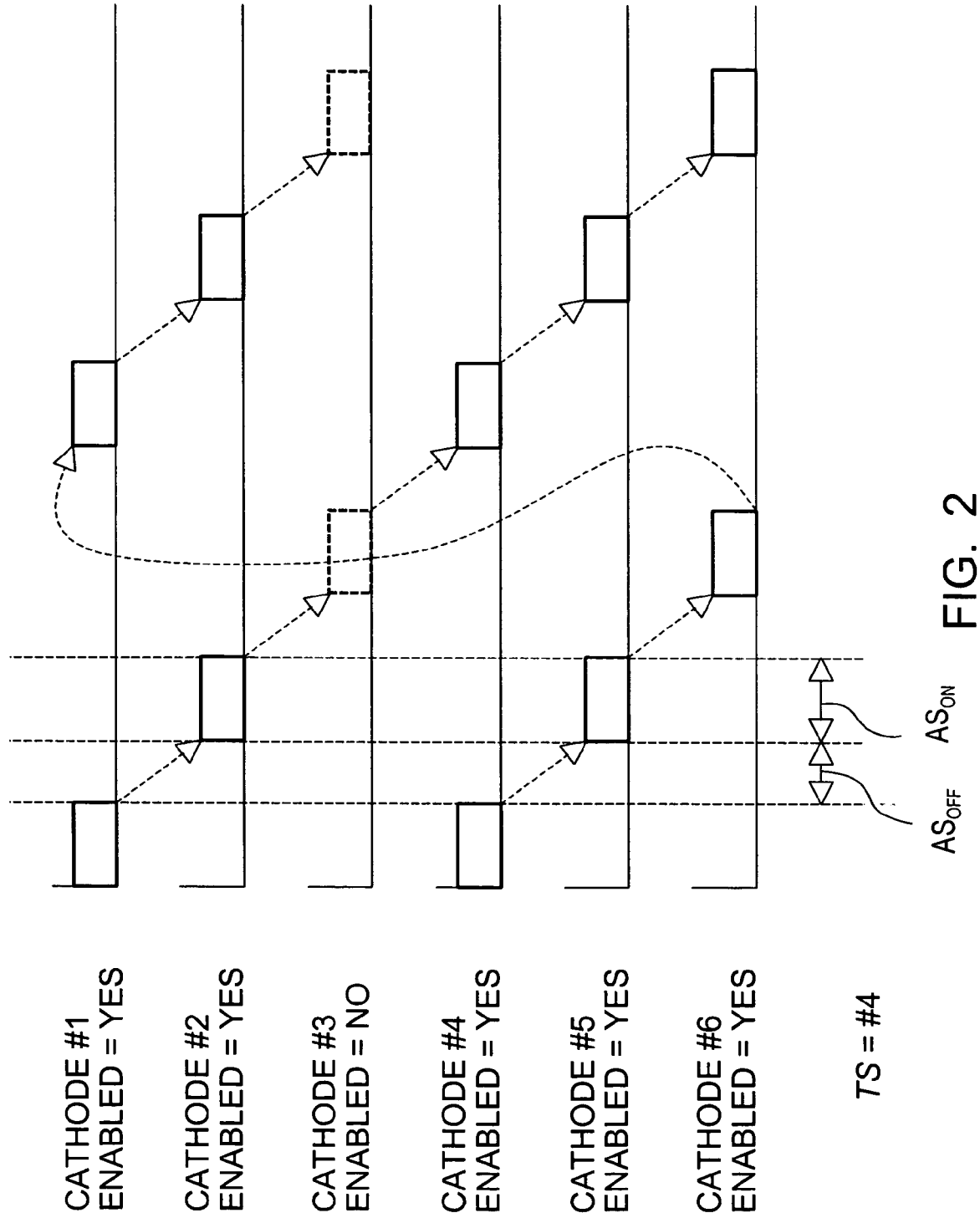
FIG. 2 is a timing diagram showing switching of cathodes to anodes according to an example embodiment of the present invention.

Although FIG. 2 shows one example embodiment of the present invention, it is contemplated that other "patterns" of switch-modes may be achieved, for example using one cathode temporarily as anode, or using more than two cathodes at the same time. Further, an overlapping mode could be realized, wherein while a first anode is present and active, a second anode is being switched two ground, after which the first anode returns to deposition mode as a third anode is being connected to ground.

Figure 3:
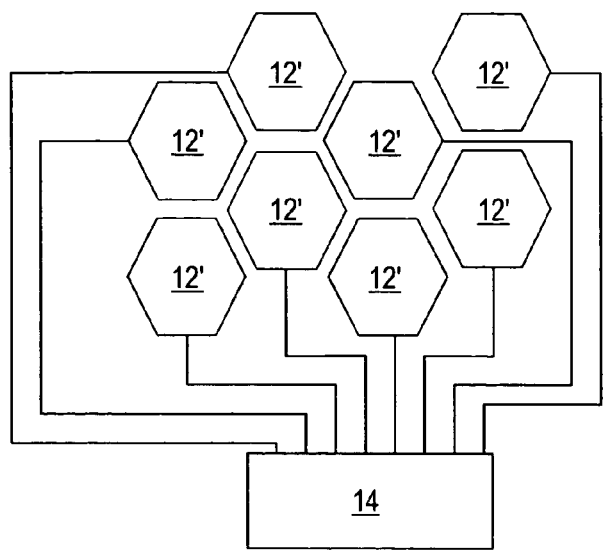
FIG. 3 is a schematic drawings showing a sliding anode sputtering source arrangement having hexagonal-shaped electrodes according to an example embodiment of the present invention.
Figure 4:
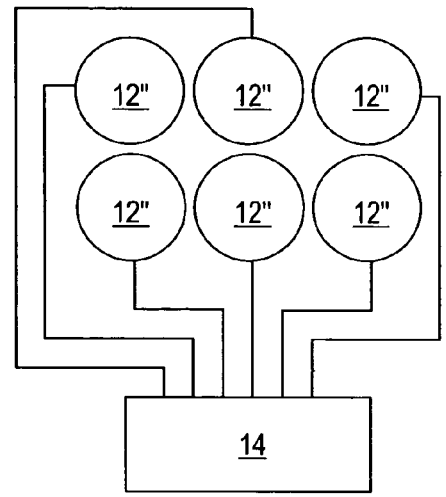
FIG. 4 is a schematic drawings showing a sliding anode sputtering source arrangement having round electrodes according to an example embodiment of the present invention.
Figure 5:
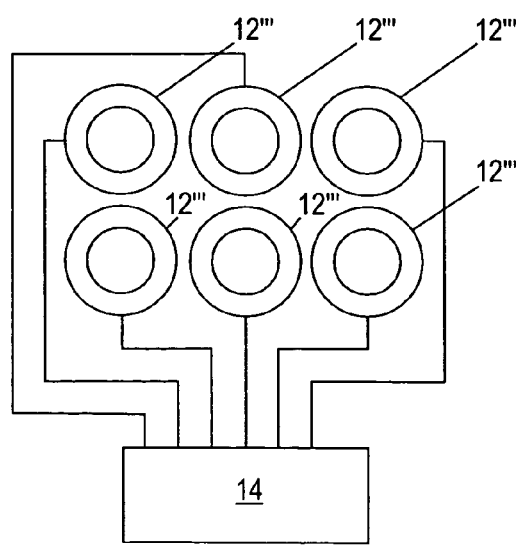
FIG. 5 is a schematic drawings showing a sliding anode sputtering source arrangement having ring-shaped electrodes according to an example embodiment of the present invention.

Further, although FIGS. 1A-1D. show bar-shaped target arrangements in a spaced-apart, parallel array, other target shapes and array configurations have been contemplated. For example, a checker-board like cathode arrangement may be provided, using analogous switching patterns. Similarly, as shown by way of example in FIGS. 3-5 the target electrodes of the present invention can have other shapes and arrangements, such as round, ring-shaped, polygon-shaped, or the like, to be grouped in checker-board, honeycomb or other suitable arrangements. FIG. 3 shows an array of hexagonal shaped electrodes 12' in a honeycomb arrangement. FIG. 4 shows an array of round electrodes 12" in a checkerboard pattern. FIG. 5 shows an array of ring-shaped electrodes 12'''.

Although not shown in detail herein, according to the present embodiment, the switching circuit comprises insulated-gate bipolar transistors (IGBT) as switching elements. IGBT's can be operate with the high cut-off voltages or reverse voltages and provide the large amounts of current necessary for sputter deposition. For example, IGBT's are commercially available that can be operated, by means of a pulsed power supply (e.g. a commercially available "Pinnacle Plus" power supply) with 1700 volts and a nominal current 100 Amps. Field effect transistors (FET) with similar properties are available up to 1500 Volts, but are not as readily available. Further, these FET's are loadable only up to about 12 amps and therefore several FET's would have to be connected in parallel to switch the amount of current necessary for sputter deposition.

Depending on the number of the target arrangements, and as mentioned above, individual target arrangements or several target arrangements could be connected to ground at one time. The more target arrangements that serve as anodes, the more the effective target area that is available, by increasing plasma density. However, the deposition rate decreases as additional target arrangements are used as anodes, since less cathodic target arrangements are operating at once. It is therefore reasonable, to use as few target arrangements as possible as anode.

In the present embodiment, the switching of target arrangements is controlled flexibly, by a programmable controller. In another embodiment of the invention, the outermost cathodes are not switched, but instead would be operated at a constant higher power to compensate for edge effects.

Further, depending on the capabilities of the power source utilized, the switching may be realized by respective clocking of the control system. As a further alternative, the cathodes may be directly connected to ground, without first disconnecting the power, in order to achieve shorter cycle times.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A magnetron sputtering source comprising:
   a plurality of electrodes; and
   a switching circuit for sequentially connecting each of said plurality of electrodes as an anode and connecting the remaining of said plurality of electrodes as cathodes,
   wherein the switching circuit provides a delay after disconnecting any of said plurality of electrodes from a ground reference before connecting any other one of said plurality of electrodes to the ground reference, and
   wherein during the delay none of said plurality of electrodes acts as an anode and at least one of said plurality of electrodes acts as a cathode.

2. The magnetron sputtering source of claim 1, wherein each of said plurality of electrodes is a bar-shaped target.

3. The magnetron sputtering source of claim 1, wherein each of said plurality of electrodes is one of a round target, a ring-shaped target and a polygon-shaped target.

4. The magnetron sputtering source of claim 1, wherein the switching circuit keeps each of said plurality of electrodes connected to the ground reference for less than 300 milliseconds.

5. The magnetron sputtering source of claim 1, wherein the delay is less than 500 milliseconds.

6. The magnetron sputtering source of claim 1, wherein said switching circuit comprises an insulated gate bipolar transistor.

7. The magnetron sputtering source of claim 1, wherein said switching circuit simultaneously connects a plurality of said plurality of electrodes to said ground reference.

8. The magnetron sputtering source of claim 1, wherein said switching circuit comprises an electrode switching selector for selecting said plurality of electrodes from an array of electrodes to be switched by said switching circuit.

9. The magnetron sputtering source of claim 1, wherein said plurality of electrodes are selected from an ray of electrodes and wherein electrode located at an outside periphery of said array of electrodes are excluded from said plurality of electrodes.

10. The magnetron sputtering source of claim 1, wherein during the sequentially connecting, one of said plurality of electrodes always remains powered as a cathode.

11. A method of operating a magnetron sputtering source comprising steps of:
   providing a plurality of target arrangements;
   causing each of said plurality of target arrangements to act as a cathode; and
   sequentially causing each of said plurality of target arrangements to temporarily act as an anode for a predetermined on-time by connecting each of said plurality of target arrangements to a ground reference,
   wherein after disconnecting any of said plurality of target arrangements from the ground reference a delay is provided for before connecting any other one of said plurality of target arrangements to the ground reference, and wherein during the delay none of said plurality of target arrangements acts as an anode and at least one of said plurality of electrodes acts as a cathode.

12. The method of operating a magnetron sputtering source of claim 11, wherein each of said plurality of target arrangements is kept as an anode for less than 300 milliseconds.

13. The method of operating a magnetron sputtering source of claim 11, wherein said predetermined on-time is less than 300 milliseconds.

14. The method of operating a magnetron sputtering source of claim 11, further comprising a step of:
after the delay for a predetermined off-time causing said any other one of said plurality of target arrangements to temporarily act as an anode.

15. The method of operating a magnetron sputtering source of claim 14, wherein said predetermined off-time is less than 500 milliseconds.

16. The method of operating a magnetron sputtering source of claim 14, wherein during the sequentially causing step, one of said plurality of electrodes always remains powered as a cathode.

* * * * *

UNITED STATES PATENT AND TRADEMARK OFFICE
CERTIFICATE OF CORRECTION

PATENT NO.        : 7,678,239 B2                                          Page 1 of 1
APPLICATION NO.   : 10/912365
DATED             : March 16, 2010
INVENTOR(S)       : Walter Haag et al.

It is certified that error appears in the above-identified patent and that said Letters Patent is hereby corrected as shown below:

In the claims, column 4, line 49, please replace "ray" with -- array --.

Signed and Sealed this

Seventeenth Day of August, 2010

David J. Kappos
*Director of the United States Patent and Trademark Office*